US012566373B2

(12) United States Patent
Senshu

(10) Patent No.: US 12,566,373 B2
(45) Date of Patent: Mar. 3, 2026

(54) HOLDING DEVICE, METHOD OF DETERMINING ATTRACTION ABNORMALITY IN HOLDING DEVICE, LITHOGRAPHY APPARATUS, AND METHOD OF MANUFACTURING ARTICLE

(71) Applicant: CANON KABUSHIKI KAISHA, Tokyo (JP)

(72) Inventor: Kohei Senshu, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 64 days.

(21) Appl. No.: 18/796,680

(22) Filed: Aug. 7, 2024

(65) Prior Publication Data

US 2024/0393682 A1      Nov. 28, 2024

Related U.S. Application Data

(62) Division of application No. 17/880,967, filed on Aug. 4, 2022, now Pat. No. 12,092,955.

(30) Foreign Application Priority Data

Sep. 10, 2021      (JP) ................................. 2021-147516

(51) Int. Cl.
| | |
|---|---|
| *G03F 7/00* | (2006.01) |
| *B25B 11/00* | (2006.01) |
| *G01M 3/26* | (2006.01) |

(52) U.S. Cl.
CPC .......... *G03F 7/0002* (2013.01); *B25B 11/005* (2013.01); *G01M 3/26* (2013.01)

(58) Field of Classification Search
CPC ...... B25B 11/005; G01M 3/26; G03F 7/0002; G03F 7/707
See application file for complete search history.

(56) References Cited

U.S. PATENT DOCUMENTS

| | | | |
|---|---|---|---|
| 9,195,129 | B2 | 11/2015 | Endo |
| 2006/0172031 | A1 | 8/2006 | Babbs et al. |

(Continued)

FOREIGN PATENT DOCUMENTS

| | | |
|---|---|---|
| JP | 2011146663 A | 7/2011 |
| KR | 1020170113166 A | 10/2017 |
| TW | 201527871 A | 7/2015 |

OTHER PUBLICATIONS

Office Action issued in U.S. Appl. No. 17/880,967 mailed Jul. 20, 2023.

(Continued)

*Primary Examiner* — Michael M. Robinson
*Assistant Examiner* — Victoria Bartlett
(74) *Attorney, Agent, or Firm* — ROSSI, KIMMS & McDOWELL LLP

(57) ABSTRACT

A holding device in a lithography apparatus for transferring a pattern formed on a mold to a substrate, for attracting/holding the mold or substrate by a reduced pressure, comprising: a holding unit holding the mold or substrate, having concave portions forming spaces together with the mold or substrate; a first pressure mechanism to depressurize at least one first space among the spaces formed by the mold or substrate and the holding unit; a second pressure mechanism setting at least one second space among the spaces to a pressure different from the first space; a controller controlling the first and second pressure mechanisms such that the first and second spaces are adjacent to each other; a measuring unit measuring a flow rate of at least the first or second pressure mechanisms; and a determining unit determining an abnormality related to attracting/holding of the mold or substrate based on the flow rate.

4 Claims, 7 Drawing Sheets

(56)  References Cited

U.S. PATENT DOCUMENTS

| | | | |
|---|---|---|---|
| 2010/0059904 | A1 | 3/2010 | Kasumi |
| 2013/0258309 | A1 | 10/2013 | Endo |
| 2017/0277039 | A1 | 9/2017 | Kawahara |
| 2017/0282439 | A1 | 10/2017 | Lu et al. |

OTHER PUBLICATIONS

Office Action issued in U.S. Appl. No. 17/880,967 mailed Jan. 11, 2024.
Notice of Allowance issued in U.S. Appl. No. 17/880,967 mailed May 30, 2024.

FIG. 3

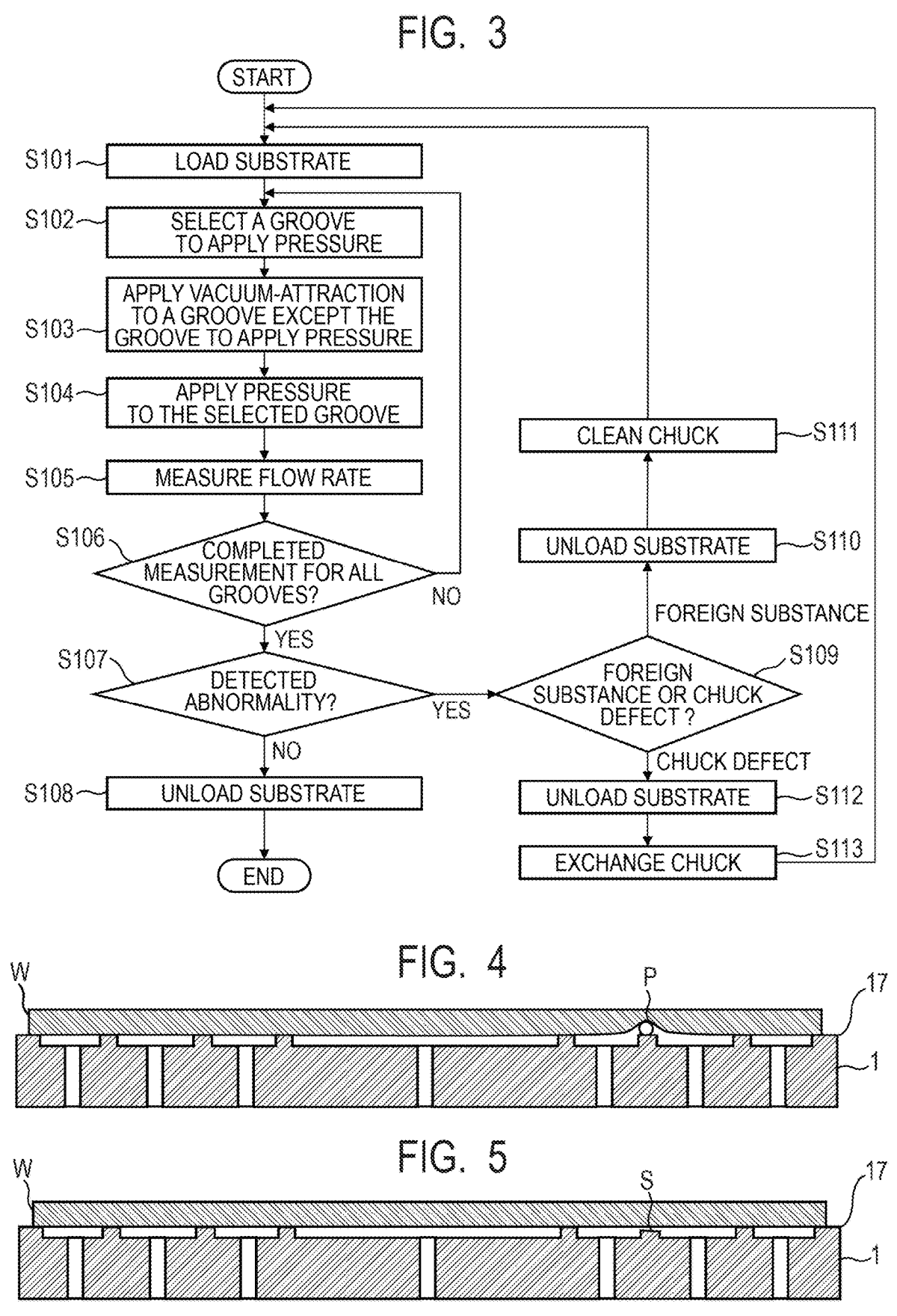

```
                        START
                          │
S101 ──  LOAD SUBSTRATE ◄─────────────────────────────┐
                          │                            │
S102 ──  SELECT A GROOVE ◄──────────┐                  │
         TO APPLY PRESSURE          │                  │
                          │         │                  │
S103 ──  APPLY VACUUM-ATTRACTION    │                  │
         TO A GROOVE EXCEPT THE     │                  │
         GROOVE TO APPLY PRESSURE   │                  │
                          │         │                  │
S104 ──  APPLY PRESSURE             │    CLEAN CHUCK ── S111
         TO THE SELECTED GROOVE     │         ▲        │
                          │         │         │        │
S105 ──  MEASURE FLOW RATE          │    UNLOAD SUBSTRATE ── S110
                          │         │         ▲        │
S106 ──  COMPLETED        │         │    FOREIGN SUBSTANCE
         MEASUREMENT FOR ALL ───────┘         │        │
         GROOVES?        NO              FOREIGN     S109
                          │              SUBSTANCE OR CHUCK
                        YES              DEFECT ?
S107 ──  DETECTED                 YES         │        │
         ABNORMALITY? ─────────────────►      CHUCK DEFECT
                          │              UNLOAD SUBSTANCE ── S112
                        NO                    │        │
S108 ──  UNLOAD SUBSTRATE               EXCHANGE CHUCK ── S113
                          │
                        END
```

HOLDING DEVICE, METHOD OF DETERMINING ATTRACTION ABNORMALITY IN HOLDING DEVICE, LITHOGRAPHY APPARATUS, AND METHOD OF MANUFACTURING ARTICLE

BACKGROUND OF THE INVENTION

Field of the Invention

The present invention relates to a holding device, a method of determining attraction abnormality in the holding device, a lithography apparatus, and a method of manufacturing an article.

Description of the Related Art

The exposure apparatus includes a substrate holding device for holding a substrate. In addition to the substrate holding device, the imprint apparatus also includes a mold holding device that holds a mold. The mold holding device or the substrate holding device generally includes a vacuum attraction type chuck having an attraction surface for holding the attracted object, a suction port formed in the chuck, and a pressure sensor for monitoring the pressure of an exhaust port communicated with the suction port. In this case, when the measured value of the pressure sensor becomes an arbitrary value (vacuum state) after the mold holding device or the substrate holding device holds the attracted object to the chuck, it is determined that the attracted object is in an attracted and held state. On the other hand, the mold holding device or the substrate holding device stops the attraction of the attracted object and returns the pressure in the exhaust port to substantially atmospheric pressure, thereby determining that the state of holding the attracted object is released.

Here, an abnormality such as adhesion of dust or formation of a flaw may occur on the back surface of the attracted object (or the chucking surface of the chuck). In order to cope with these abnormalities, Japanese Patent Application Laid-Open No. 2011-146663 discloses a substrate holding device capable of measuring a physical quantity related to attraction at the time of attracting of substrate, determining an attraction state from the measured physical quantity, and changing a control of holding.

However, although the substrate holding device disclosed in Japanese Patent Application Laid-Open No. 2011-146663 measures a physical quantity related to attraction at the time of attracting, there is a problem that it is difficult to determine an attraction abnormality because a measurement value at the time of abnormal attraction becomes small when a foreign substance or a change in surface state between the attracted object and the attraction face is minute.

SUMMARY OF THE INVENTION

Therefore, the present invention provides a holding device capable of determining an attraction abnormality of a mold holding device or a substrate holding device with high accuracy.

According to another aspect of the present invention, a holding device used in a lithography apparatus for transferring a pattern formed on a mold to a substrate, for attracting and holding the mold or the substrate by a reduced pressure, including: a holding unit configured to hold the mold or the substrate, having a plurality of concave portions forming a plurality of spaces together with the mold or the substrate;

a first pressure mechanism capable of depressurizing at least one first space among the plurality of spaces formed by the mold or the substrate and the holding unit; a second pressure mechanism capable of setting at least one second space among the plurality of spaces to a pressure different from that of the first space; a controller configured to control the first and second pressure mechanisms such that the first and second spaces are adjacent to each other; a measuring unit configured to measure a flow rate of at least one of the first and second pressure mechanisms; and a determining unit configured to determine an abnormality related to attracting and holding of the mold or the substrate based on a measured flow rate.

According to the present invention, it is possible to provide a holding device capable of determining an attraction abnormality of a mold holding device or a substrate holding device with high accuracy.

Further features of the present invention will become apparent from the following description of exemplary embodiments with reference to the attached drawings.

BRIEF DESCRIPTION OF THE DRAWINGS

FIG. 3 is a flowchart of a method for determining an attraction abnormality in the first embodiment of the substrate holding device.

FIG. 4 is a view showing a state in which a foreign substance is sandwiched between a holding surface of a substrate holding device and a wafer.

FIG. 5 is a diagram illustrating a state in which an abnormality due to abrasion over time occurs on a holding surface of a substrate holding device.

DESCRIPTION OF THE EMBODIMENTS

First Embodiment

A configuration of a substrate holding device according to a first embodiment of the present invention will be described.

Figure 1:
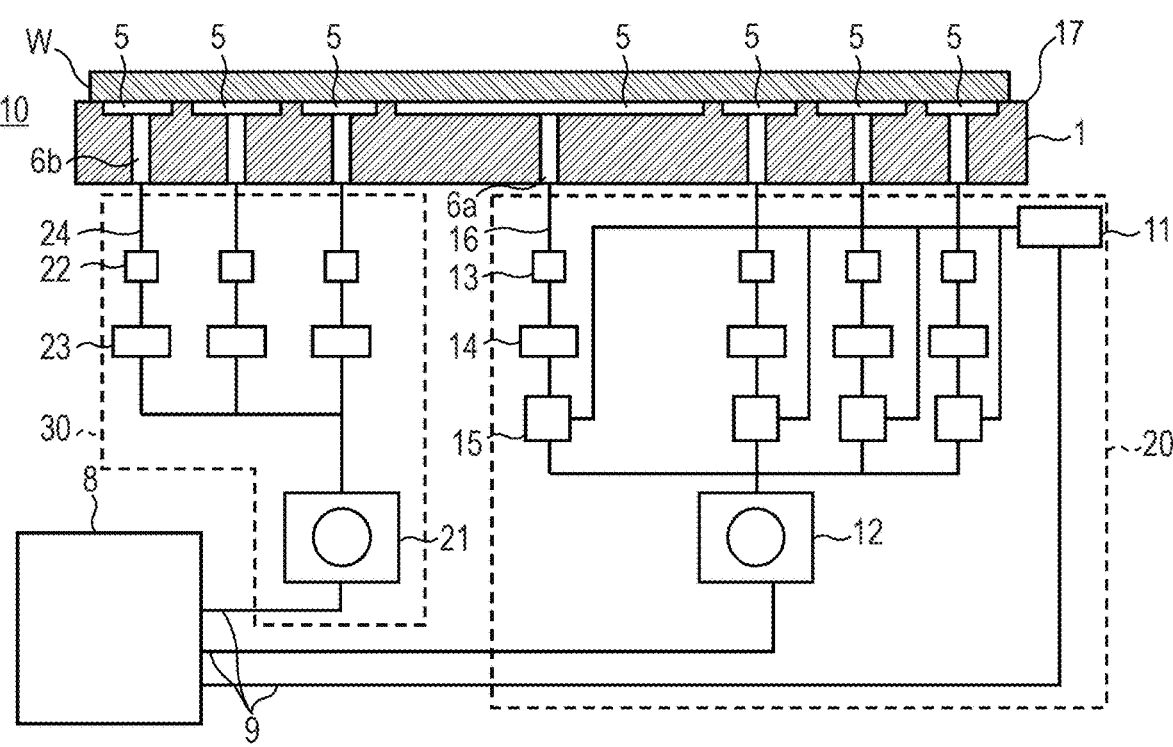
FIG. 1 is a view showing a substrate holding device according to a first embodiment of the present invention.

FIG. 1 is a schematic view showing the configuration of the substrate holding device 10. The substrate holding device 10 includes a wafer chuck main body (main body unit) 1, a vacuum exhaust system (pressure mechanism, first pressure mechanism) 20, a pressurized air system (pressure mechanism, second pressure mechanism) 30, and a main controller (determination unit) 8. The wafer chuck main body (main body portion) 1 has a holding surface (holding portion) 17 for holding a wafer (substrate) W. The vacuum exhaust system 20 applies a force (negative pressure) for attracting the wafer W mounted on the wafer chuck main body 1 to the holding surface 17. The pressurized air system 30 applies a positive pressure to a space formed between the wafer W and the wafer chuck main body (main body portion) 1. The main controller 8 controls the entire apparatus in which the substrate holding device 10 is installed. In the present embodiment, the substrate holding device 10 is applied to a stage device that moves the wafer W in the exposure apparatus, and the main controller 8 controls the entire exposure apparatus.

Figure 2A:
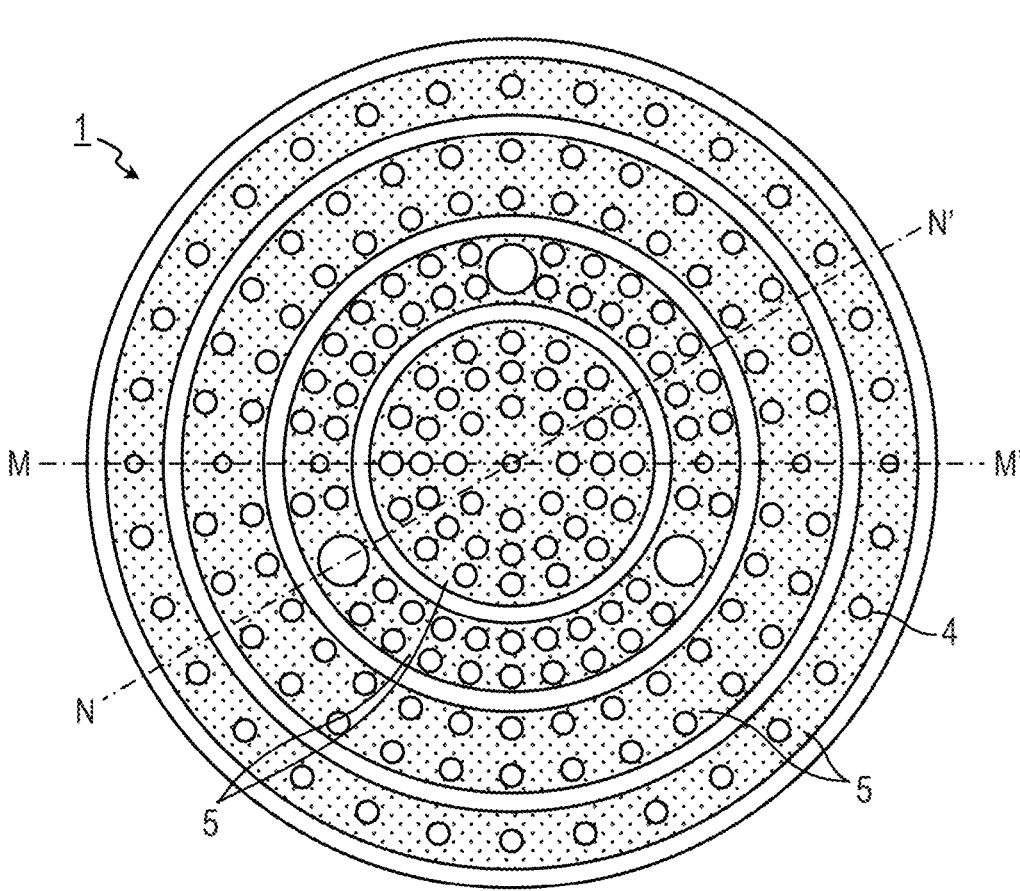
FIG. 2A illustrates a chuck main body of the substrate holding device.
Figure 2B:
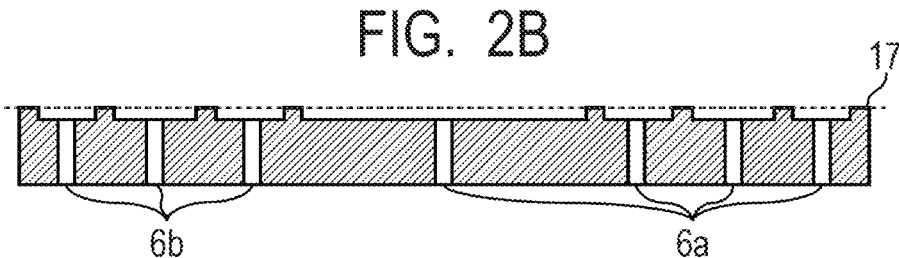
FIG. 2B is a cross-sectional view taken along line M-M' in FIG. 2A.
Figure 2C:
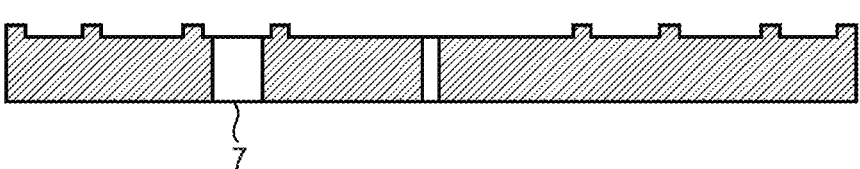
FIG. 2C is a cross-sectional view taken along line N-N' in FIG. 2A.

FIGS. 2A, 2B and 2C are schematic views showing the structure of the wafer chuck main body 1. In particular, FIG. 2A is a plan view of the wafer chuck main body 1, and FIGS. 2B and 2C are cross-sectional views taken along lines M-M' and N-N' in FIG. 2A, respectively.

The wafer chuck main body 1 has a plurality of grooves (a plurality of concave portions) 5 on a holding surface 17 side for holding the wafer W. With respect to the number of the grooves 5, as will be described later, it is desirable that about four grooves are provided at equal intervals therebetween in the radial direction in the circular wafer chuck main body 1 as shown in FIG. 2A in order to measure the flow rate with respect to a plurality of spaces formed by the grooves 5 of the wafer chuck main body 1 and the wafer W. Further, as shown in FIG. 2B, the groove 5 is provided with four exhaust ports 6a and three air supply ports 6b which penetrate the lower surface of the wafer chuck main body 1. It is desirable that the exhaust ports 6a and the air supply ports 6b are arranged in a line and with an equal interval therebetween as shown in the M-M' portion in FIG. 2A. The number of the grooves 5 and the numbers of the exhaust ports 6a and the air supply ports 6b are not particularly limited.

A plurality of convex portions 4 having the same height as that of the holding surfaces 17 formed by etching are provided on the surfaces of the grooves 5 (shown only in FIG. 2A). The arrangement of the convex portions 4 is not particularly limited, and various types such as an orthogonal lattice shape, a staggered lattice shape, and a concentric circumferential shape can be considered. The interval (pitch) between the convex portions 4 is preferably set such that when the wafer W is held, deformation does not occur due to the wafer W sinking in the direction of the groove 5 by the suction force of the vacuum exhaust system 20.

Further, the wafer chuck main body 1 has three through-holes 7 for lift pins (not shown) which perform a vertical operation for lifting the wafer W from the holding surface 17 of the wafer chuck main body 1 when the wafer W is mounted. In general, the wafer W is placed on the wafer chuck main body 1 by a substrate conveyance device (not shown) placing the wafer W on lift pins and lowering the lift pins.

The vacuum exhaust system 20 includes a vacuum pump 12, and further includes, on the exhaust port 6a, a solenoid valve 13, a vacuum regulator 14, a flow rate sensor (measurement unit) 15, and a vacuum exhaust line 16 that connects these components to the exhaust port 6a of the wafer chuck main body 1. The vacuum pump 12 is an exhaust means used to hold the wafer W by reducing the pressure in a space formed by the wafer W mounted on the wafer chuck main body 1 and the groove 5. The pressure is adjusted to a predetermined pressure by the vacuum regulator 14 and the main controller 8, and the space formed by the groove 5 selected by the solenoid valve 13 can be depressurized (controlled). The vacuum pump 12 and each of the plurality of grooves 5 can be selectively connected by a solenoid valve 13. Although the vacuum exhaust line 16 is connected only to the wafer chuck main body 1 for convenience in this embodiment, it may be connected to another vacuum exhaust line. As described above, the substrate holding device 10 according to the present embodiment includes the wafer chuck main body 1, the vacuum exhaust line 16, and a decompression unit constituted by the vacuum pump 12.

Further, the vacuum exhaust system 20 includes flow rate sensors 15 installed in the plurality of vacuum exhaust lines 16, respectively. Further, the vacuum exhaust system 20 includes a flow rate information controller 11 that manages measurement results of the flow rate sensors 15.

Each of the flow rate sensors 15 is a measuring unit that measures a flow rate value of each of the vacuum exhaust lines 16. Although one flow rate sensor 15 is installed in each vacuum exhaust line 16 in the present embodiment, the number of installed flow rate sensors 15 may be less than four as long as the flow rate values of a plurality of vacuum exhaust lines 16 can be measured by one flow rate sensor 15.

The pressurized air system 30 is provided with a pressurizing pump 21, and further provided, on the air supply port 6b, with a solenoid valve 22, a regulator 23, and a pressurizing line 24 for connecting them to the air supply port 6b of the wafer chuck main body 1. The pressurizing pump 21 is pressurizing means for supplying air to a space formed by the wafer W mounted on the wafer chuck main body 1 and the groove 5 to pressurize the space. The pressure is adjusted to a predetermined pressure by the regulator 23 and the main controller 8, and the space formed by the groove 5 selected by the solenoid valve 22 can be pressurized (can be controlled). The pressurizing pump 21 and each of the plurality of grooves 5 can be selectively connected by a solenoid valve 22.

Although the pressurizing line 24 is connected only to the wafer chuck main body 1 for convenience in this embodiment, it may be connected to another pressurizing line. As described above, the substrate holding device 10 according to the present embodiment includes the wafer chuck main body 1, the pressurizing line 24, and a pressurizing unit constituted by the pressurizing pump 21.

The flow rate information controller 11 is an information controller that manages flow rate information including measurement results measured by the flow rate sensors 15. Here, the "flow rate information" refers to a flow rate or a flow velocity measured by the flow rate sensor 15. Further, the flow rate information controller 11 sequentially monitors flow rate information of the flow rate sensor 15 and transmits the flow rate information to the main controller 8. In the present embodiment, the flow rate sensor 15 is provided in each vacuum exhaust line 16 of the vacuum exhaust system 20, but may be provided in the pressurizing line 24 of the pressurized air system 30. In addition, a differential pressure gauge may be configured instead of the flow rate sensor 15, and the flow rate or flow velocity flowing through each vacuum exhaust line 16 may be calculated from the differential pressure.

The main controller 8 is a controller that controls the attraction operation of the substrate holding device 10, the vacuum pump 12, the vacuum regulator 14, the solenoid valve 13, and the flow rate information controller 11 in the vacuum exhaust system 20, the pressurizing pump 21, the regulator 23, the solenoid valve 22, and the like in the pressurized air system 30. Further, the main controller 8 controls the entire apparatus in which the substrate holding device 10 is installed. The main controller 8 is configured by a computer, a sequencer, or the like including various operation programs. The main controller 8 transmits operation commands to the vacuum pump 12, the vacuum regulator 14, the solenoid valve 13, the flow rate information controller 11, the pressurizing pump 21, the regulator 23, the solenoid valve 22, and the like, which are connected by the LAN cable 9 or the like. Further, the main controller 8 can store the flow rate information transmitted from the flow rate information controller 11 in a storage device (storage unit) such as a memory provided therein, and can appropriately read past flow rate information (history information). In the present embodiment, the flow rate information controller 11 and the main controller 8 are described as separate units, but one controller may have both functions.

Next, an overall flow of a maintenance method of the substrate holding device 10 will be described with reference to a flowchart shown in FIG. 3.

First, the main controller 8 loads the wafer W and places it on the holding surface 17 of the substrate holding device 10 (step S101). It is preferable to use the wafer W to be mounted here in which abnormality with respect to a planar state such as warpage has not been recognized in advance measurement.

Next, the main controller 8 selects a groove 5 to be pressurized from the plurality of grooves 5 of the substrate holding device 10. The solenoid valve 22 of the pressurized air system 30 corresponding to the selected groove 5 is opened, the other solenoid valves 22 and the solenoid valve 13 of the vacuum exhaust system 20 corresponding to the selected groove 5 are closed, and the other solenoid valves 13 are opened (step S102).

Next, the main controller 8 drives the vacuum pump 12 to perform vacuum attraction until the pressure set by the vacuum regulator 14 is reached, thereby reducing the pressure in the space (first space) formed by the groove 5 corresponding to the opened solenoid valves 13 and starting attraction of the wafer W (step S103). Here, the suction pressure is set to about −60 kPa, for example.

Thereafter, the main controller 8 drives the pressurizing pump 21 to pressurize the space (second space) formed by the selected groove 5 up to the pressures set by the regulator 23 (step S104). Here, the pressures are set to, for example, about 10 kPa.

In this state, the main controller 8 causes the flow rate information controller 11 to cause the flow rate sensor 15 to acquire a flow rate value at an arbitrary time interval, to create each piece of flow rate information, and to receive the flow rate information from the flow rate information controller 11 (step S105). Here, the groove 5 for measuring the flow rate value may be only the groove 5 adjacent to the pressurized groove 5, but the flow rate values of all the flow rate sensors may be acquired. The acquired flow rate information is stored in the flow rate information controller 11.

The flow from step S102 to step S105 is repeated until all the grooves 5 are pressurized and flow rate values are acquired (step S106).

Next, the main controller 8 confirms whether or not the flow rate information is equal to or less than a specified value based on the flow rate information obtained from step S102 to step S106. When it is within the specified value, it is determined that there is no abnormality, and when it exceeds the specified value, it is determined that an abnormality has occurred between the holding surface 17 and the wafer W (step S107). The specified value here is preferably a flow rate value acquired when no abnormality occurs between the holding surface 17 and the wafer W, for example, a flow rate value acquired in a state in which no foreign substance is sandwiched by an unused wafer chuck main body.

When it is determined in step S107 that there is no abnormality, the main controller 8 unloads the wafer and ends the maintenance (step S108).

If it is determined in step S107 that an abnormality has occurred, the cause of the abnormality is determined (step S109).

Here, two types of abnormality causes are determined. A first cause of the abnormality is a case where a foreign substance P is sandwiched between the holding surface 17 and the wafer W (contact surface) (FIG. 4). A second cause of the abnormality is a case where abrasion (aging deterioration) S over time occurs on the holding surface 17, and the abnormality occurs (FIG. 5). In a case where such an abnormality occurs, when one of the two grooves 5 sandwiching the portion where the abnormality occurs (the portion where the gas flows between the adjacent grooves 5) is attracted and the other is pressurized, a flow is generated due to the pressure difference between the grooves, and the measured flow rate value increases. When the flow rate value exceeds a specified value, it is determined that an abnormality has occurred.

The main controller 8 refers to past flow rate information stored in the flow rate information controller 11, and compares the past flow rate information with flow rate information at the time of abnormality. When the flow rate information at the time of abnormality deviates from the temporal change of the past flow rate information, the main controller 8 determines that the cause of the abnormality is the pinching of the foreign substance P. In addition, when the flow rate information at the time of abnormality matches the tendency of the temporal change of the past flow rate information, the main controller 8 determines that the cause of the abnormality is due to the abrasion S generated on the holding surface 17 (step S109).

When it is determined that the abnormality is caused by the sandwiching of the foreign substance P, the wafer W is unloaded (step S110), the holding surface 17 is cleaned (step S111), and the flow is executed again from step S101.

When it is determined that the abnormality is caused by the abrasion S of the holding surface 17, the wafer W is unloaded (step S112), the wafer chuck main body 1 is replaced (step S113), and the flow is executed again from step S101.

As described above, according to the present embodiment, at the time of maintenance of the substrate holding device 10, a pressure difference is given by suction and pressurization of the grooves 5, and an abnormality between the holding surface 17 and the wafer W can be detected with high accuracy by referring to flow rate information of air flowing between the grooves 5. Further, by performing the recovery processing corresponding to each abnormality, it is possible to prevent deterioration of the flatness of the wafer W due to the abnormality between the holding surface 17 and the wafer W. In addition, a large-scale attraction abnormality detection device is not required, which is advantageous in terms of cost and space.

(Exposure Apparatus)

Figure 6:
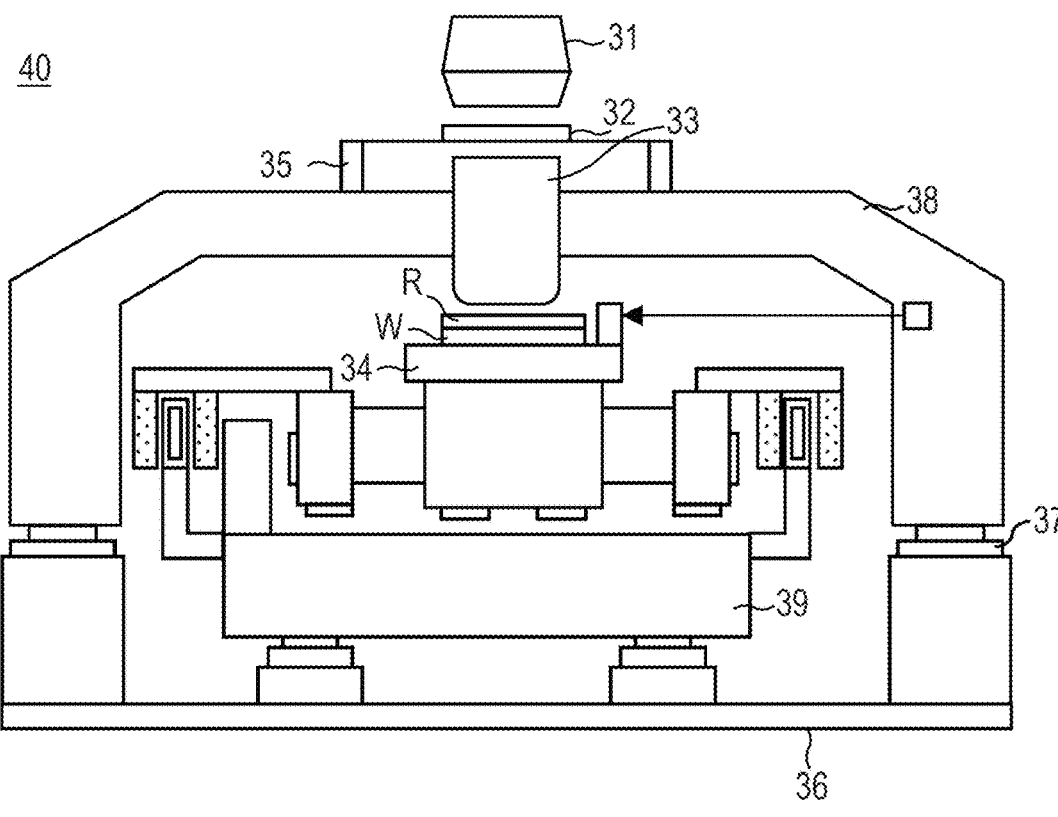
FIG. 6 is a configuration diagram of an exposure apparatus to which the first embodiment of the substrate holding device is applied.

Next, an embodiment of an exposure apparatus will be described as an example of a lithography apparatus to which the substrate holding device 10 according to the first embodiment of the present invention is applied. FIG. 6 is a schematic diagram showing the configuration of the exposure apparatus 40. The exposure apparatus 40 includes an illumination optical system 31, a reticle stage 32 that holds a reticle (original), a projection optical system 33, and a substrate stage 34 that holds a substrate (wafer) W. The exposure apparatus 40 in the present embodiment is a scanning projection exposure apparatus that employs a step-and-repeat method or a step-and-scan method and transfers a circuit pattern formed on a reticle onto the substrate W.

The illumination optical system 31 includes a light source unit (not shown) and illuminates a reticle on which a circuit pattern to be transferred is formed. In the light source unit, for example, a laser is used as a light source. Usable lasers include an ArF excimer laser having a wave length of about 193 nm, a KrF excimer laser having a wave length of about 248 nm, and a F2 excimer laser having a wave length of about 157 nm. The type of the laser is not limited to an excimer laser, and for example, a YAG laser may be used, and the number of lasers is not limited.

When a laser is used as the light source unit, it is preferable to use a light beam shaping optical system for shaping a parallel light beam from a laser light source into a desired beam shape, and an incoherent optical system for converting a coherent laser into an incoherent laser. Furthermore, the light source that can be used in the light source unit is not limited to a laser, and one or a plurality of lamps such as a mercury lamp and a xenon lamp can also be used.

The illumination optical system 31 includes a lens, a mirror, a light integrator, a diaphragm, and the like. Generally, in the illumination optical system 31, a condenser lens, a fly-eye lens, an aperture stop, a condenser lens, a slit, and an imaging optical system are arranged in this order. The illumination optical system 31 can be used for both on-axis light and off-axis light. The light integrator includes an integrator formed by stacking a fly-eye lens, two sets of cylindrical lens array plates, and the like. The light integrator may be replaced with an optical rod or a diffraction element. The aperture stop is configured as a circular stop, an annular illumination stop for modified illumination, a four pole illumination stop, or the like.

The reticle is made of, for example, quartz glass, and a circuit pattern to be transferred is formed on the reticle. The reticle stage 32 is a stage movable in a direction in a plane parallel to the substrate holding surface, and is a device for holding the reticle. The reticle stage 32 is held by a reticle stage surface plate 35.

The projection optical system 33 projects and exposes the pattern on the reticle illuminated by the exposure light from the illumination optical system 31 onto the substrate W at a predetermined magnification (for example, ¼ or ⅕). As the projection optical system 33, an optical system constituted by only a plurality of refractive optical elements or an optical system (catadioptric optical system) constituted by a plurality of refractive optical elements and at least one concave mirror can be employed. Alternatively, as the projection optical system 33, an optical system constituted by a plurality of refractive optical elements and at least one diffractive optical element such as a kinoform, an all-mirror type optical system, or the like can be employed. The reticle stage surface plate 35 and the projection optical system 33 are supported on a floor surface (base surface) 36 by a lens barrel surface plate 38 via a damper 37.

The substrate W is an object to be processed, such as a silicon wafer, whose surface is coated with a resist (photosensitive agent) R. The substrate stage 34 is a stage that includes the substrate holding device 10 of the present invention and is movable in a direction in a plane parallel to the substrate holding surface, and is a device that holds the substrate W. The substrate stage 34 is installed on a stage surface plate 39 placed on a floor surface (base surface) 36.

In the exposure apparatus 40 of the present embodiment, diffracted light emitted from the reticle passes through the projection optical system 33 and is projected onto the substrate W. The substrate W and the reticle are in a conjugate relationship. In the case of a scanning-type projection exposure apparatus, the reticle pattern is transferred onto the substrate W by scanning the reticle and the substrate W. In the case of a stepper (step-and-repeat type exposure apparatus), exposure is performed in a state where the reticle and the substrate W are stationary. The substrate holding device 10 of the present invention is not limited to the exposure apparatus 40 exemplified above, and can be applied to a lithography apparatus that in which a pattern is transferred onto the substrate W.

Second Embodiment

Figure 7:
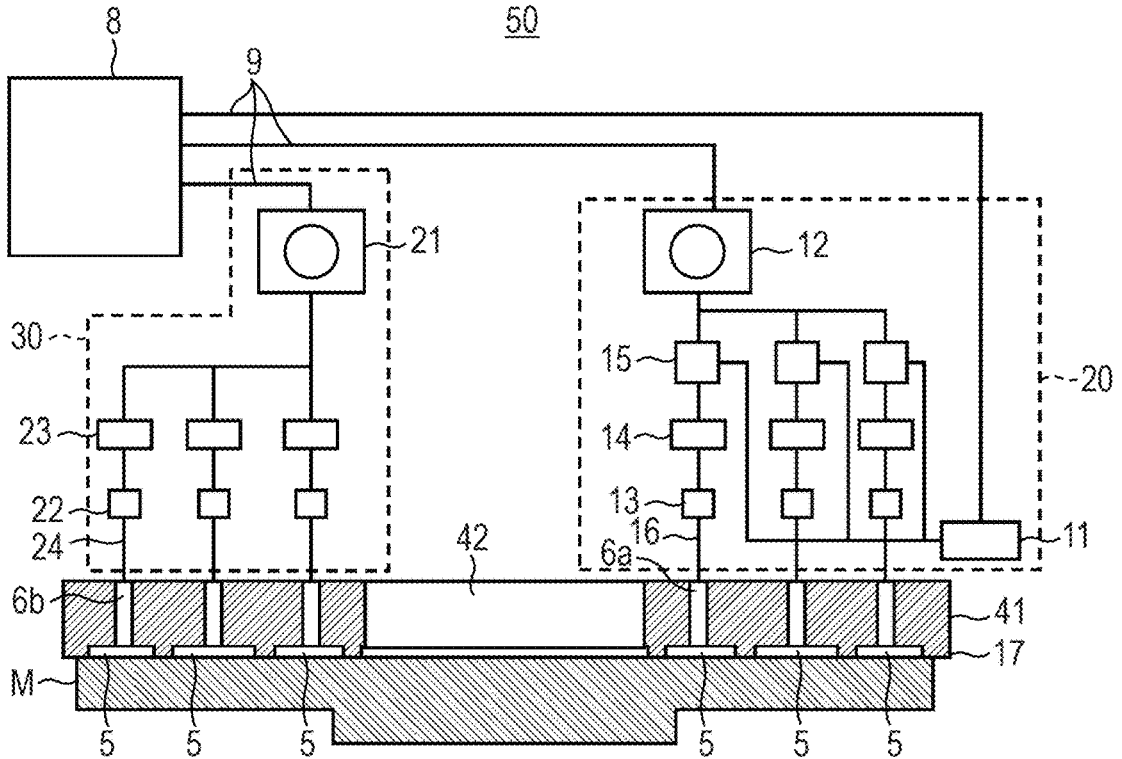
FIG. 7 is a view showing a mold holding device according to a second embodiment.

A configuration of a mold holding device according to a second embodiment of the present invention will be described. FIG. 7 is a schematic view showing the configuration of the mold holding device 50. In FIG. 7, the same components as those in FIG. 1 are denoted by the same reference numerals, and description thereof will be omitted. The mold holding device 50 of the present embodiment is a device that performs attraction and holds the mask (mold) M.

Figure 8A:
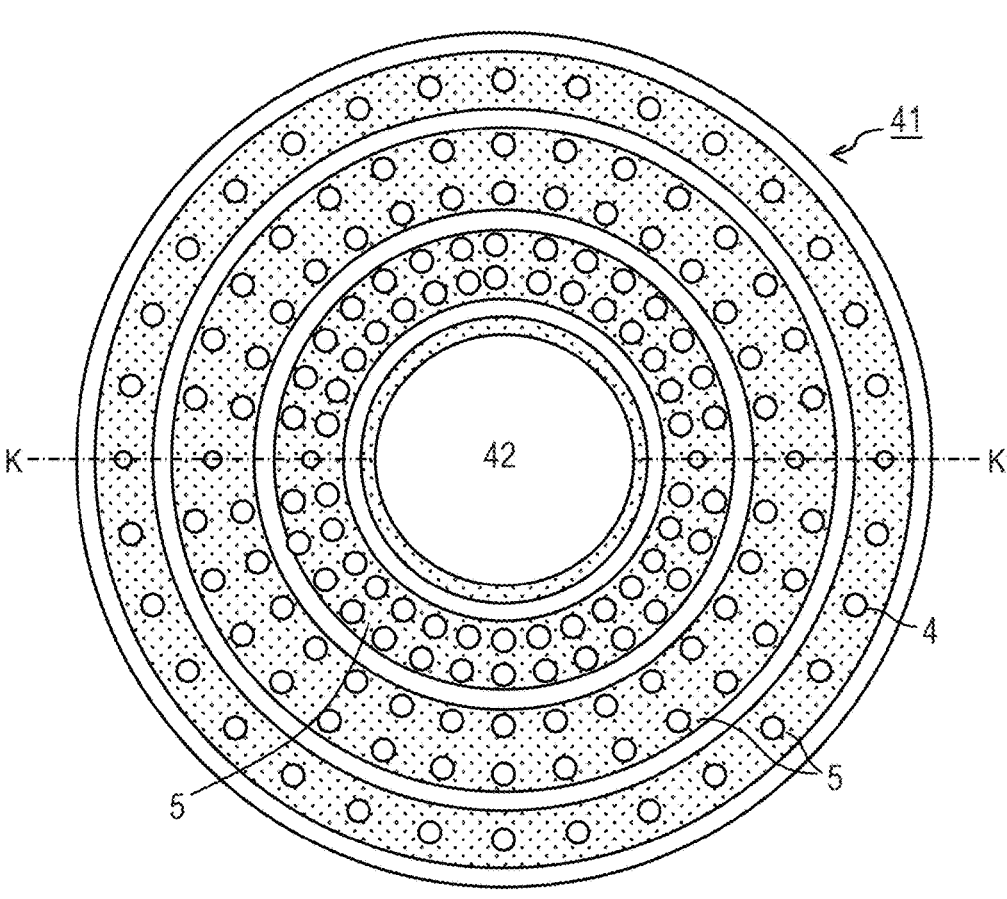
FIG. 8A is a view showing a chuck main body of a mold holding device according to a second embodiment.
Figure 8B:
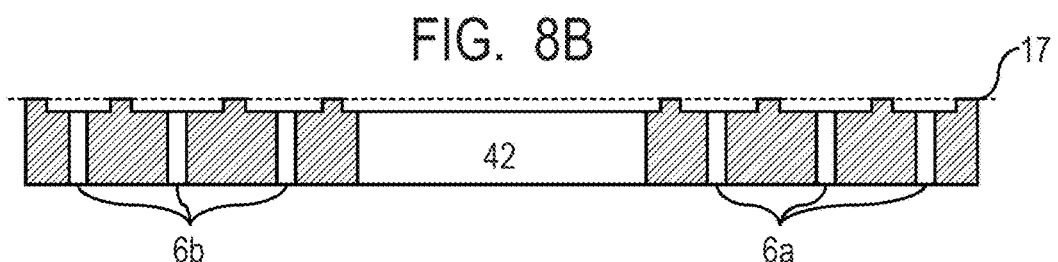
FIG. 8B is a cross-sectional view taken along line K-K' in FIG. 8A.

FIGS. 8A and 8B are schematic views showing the structure of the mask chuck main body 41 provided in the mold holding device 50. In particular, FIG. 8A is a plan view of the mask chuck main body 41, and FIG. 8B is a cross-sectional view taken along line K-K' in FIG. 8A.

Figure 9:
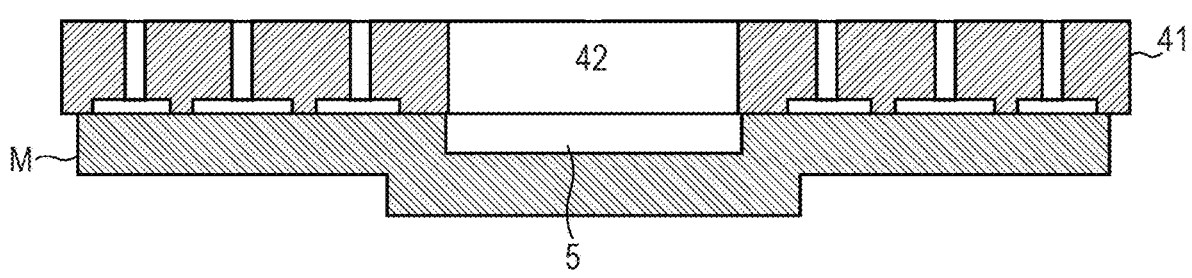
FIG. 9 is a view showing an example in which grooves are provided in a mold according to the second embodiment.

Although the mask chuck main body 41 in FIG. 8A has a plurality of grooves 5 on the side of the holding surface 17 for attracting the mask M, the grooves 5 may be provided on the mask M as shown in FIG. 9. The mold holding device 50 according to the second embodiment is also applied to an imprint apparatus to be described later, and the mask chuck main body 41 has an opening 42 in order to have a configuration in which ultraviolet light for curing an imprint material can be guided to the imprint material through the mask M.

Figure 10:
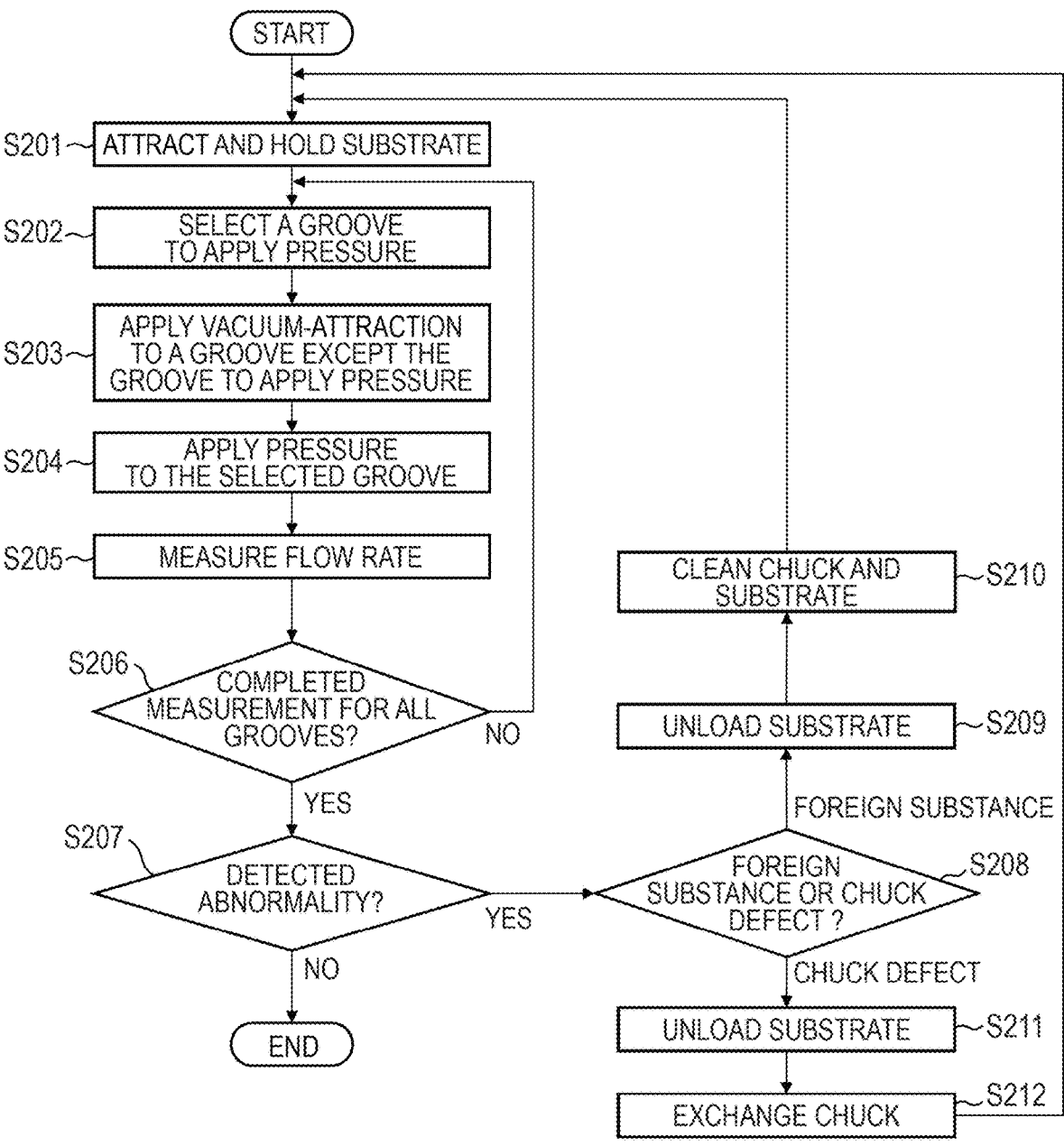
FIG. 10 is a flowchart of a method for determining attraction abnormality in the second embodiment of the mold holding device.

Next, an overall flow of a method of holding the mask M by the mold holding device 50 will be described with reference to a flowchart shown in FIG. 10.

First, the main controller 8 loads the mask M and attracts and holds it on the holding surface 17 of the mold holding device 50 (step S201). It is preferable to use the mask M to be held here for which an abnormality such as a flaw has not been confirmed on the surface of the mask M to be held in a previous measurement.

Next, the main controller 8 selects a groove 5 to be pressurized from the plurality of grooves 5 of the mold holding device 50. The solenoid valve 22 of the pressurized air system 30 corresponding to the selected groove 5 is opened, the other solenoid valves 22 and the solenoid valve 13 of the vacuum exhaust system 20 corresponding to the selected groove 5 are closed, and the other solenoid valves 13 are opened (step S202).

Next, the main controller 8 drives the vacuum pumps 12 to perform vacuum attraction until the pressure set by the vacuum regulators 14 is reached, thereby reducing the pressures in the space (first space) formed by the groove 5 corresponding to the opened solenoid valves 13 and starting attraction of the mask M (step S203). Here, the attraction pressure is set to about −60 kPa, for example.

Thereafter, the main controller 8 drives the pressurizing pump 21 to pressurize the space (second space) formed by the selected groove 5 up to the pressure set by the regulators 23 (step S204). Here, the pressure is set to, for example, about 10 kPa.

In this state, the main controller 8 causes the flow rate information controller 11 to cause the flow rate sensor 15 to acquire a flow rate value at an arbitrary time interval, to create each piece of flow rate information, and to receive the flow rate information from the flow rate information controller 11 (step S205). Here, the groove 5 for which the flow rate value is measured may be only the groove 5 adjacent to the pressurized groove 5, but the flow rate values may be acquired by all the flow rate sensors 15. The acquired flow rate information is stored in the flow rate information controller 11.

The flow from step S202 to step S205 is repeated until all the grooves 5 are pressurized and flow rate values are acquired (step S206).

Next, the main controller 8 confirms whether or not the flow rate information is equal to or less than a specified value based on the flow rate information obtained from step S202 to step S206. If the flow rate information is within the specified value, it is determined that there is no abnormality, and if it exceeds the specified value, it is determined that an abnormality has occurred between the holding surface 17 and the mask M (step S207). The specified value here is preferably a flow rate value acquired when no abnormality occurs between the holding surface 17 and the mask M, for example, a flow rate value acquired in a state where no foreign substance is sandwiched by the unused mask chuck main body 41.

When it is determined in step S207 that there is no abnormality, it is determined that the mask M is normally attracted, and the flow is ended.

If it is determined in step S207 that an abnormality has occurred, the cause of the attraction abnormality is determined (step S208).

The cause of the abnormality is classified into two types. A first cause of the abnormality is a case where the foreign substance P is sandwiched between the holding surface 17 and the mask M (not shown). A second cause of the abnormality is a case where abrasion S over time occurs on the holding surface 17 and the abnormality occurs (not illustrated). In a case where such an abnormality occurs, when one of the two grooves 5 sandwiching a portion where the abnormality occurs (a portion where gas flows between the adjacent grooves 5) is sucked and the other is pressurized, a flow is generated due to a pressure difference between the grooves 5, and a measured flow rate value increases to exceed the specified value. Thus, the abnormality is determined.

The main controller 8 refers to past flow rate information stored in the flow rate information controller 11, and compares the past flow rate information with flow rate information at the time of abnormality. When the flow rate information at the time of abnormality deviates from the temporal change of the past flow rate information, the main controller 8 determines that the cause of the abnormality is a sandwiching of a foreign object. In addition, when the flow rate information at the time of abnormality matches the tendency of the temporal change of the past flow rate information, the main controller 8 determines that the cause of the abnormality is an abrasion occurring on the holding surface 17 (step S208).

In the case of an abnormality due to sandwiching of foreign substance, the mask M is unloaded (step S209), the holding surface 17 and the surface of the mask M to be attracted are cleaned (step S210), and the flow is executed again from step S201.

When it is determined that the abnormality is caused by the abrasion S of the holding surface 17, the mask M is unloaded (step S211), the mask chuck main body 41 is replaced (step S212), and the flow is executed again from step S201.

As described above, according to the present embodiment, when the mask M is attracted, a pressure difference is given by suction and pressurization of the groove 5, and an abnormality between the holding surface 17 and the mask M can be detected with high accuracy by referring to the flow rate information of the air flowing through the grooves 5. In addition, by performing recovery processing corresponding to each abnormality, it is possible to prevent a change in the holding posture of the mask M due to an abnormality between the holding surface 17 and the mask M, and to prevent the mask M from falling off due to a poor attraction. In addition, a large-scale attraction abnormality detection device is not required, which is advantageous in terms of cost and space.

(Imprint Apparatus)

Figure 11:
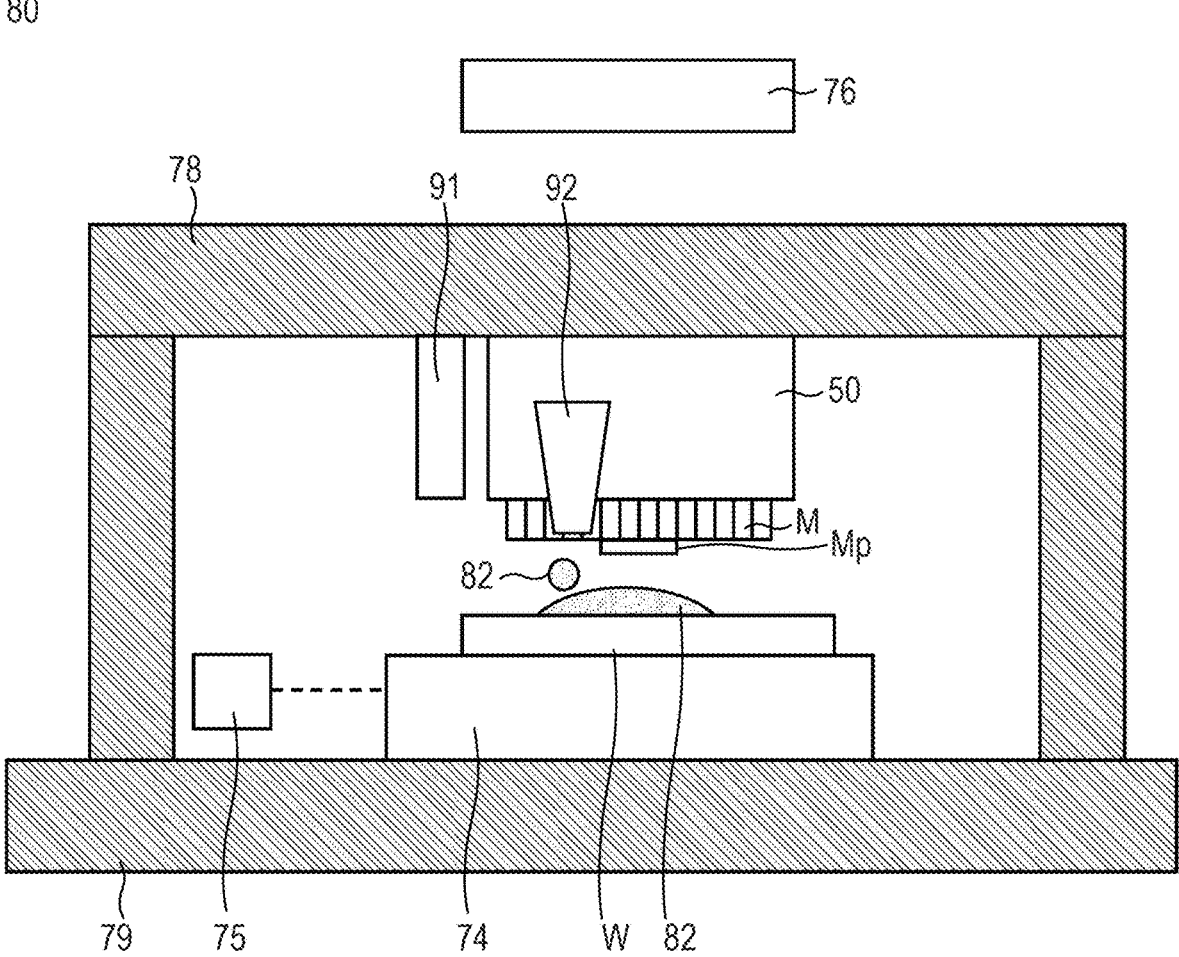
FIG. 11 is a configuration diagram of an imprint apparatus to which the second embodiment of the mold holding device is applied.

Next, an embodiment of an imprint apparatus will be described as an example of a lithography apparatus to which the mold holding device 50 according to the second embodiment of the present invention is applied. FIG. 11 is a cross-sectional view of an imprint apparatus 80 according to the second embodiment. The imprint apparatus 80 includes a mold holding device 50 that holds the mask M. The mask M has a pattern surface Mp on which a pattern is formed. The mold holding device 50 is attached to the structure 78, and can be driven in a direction in which the substrate W and the mask M approach and separate from each other by a drive source and a main controller (not shown).

A substrate stage 74 driven on a stage surface plate 79 holds a wafer W. In order to supply (apply) the resin 82 as an imprint material to the wafer W, a supply mechanism (coating mechanism 92) is provided inside the imprint apparatus 80. The coating mechanism 92 supplies the resin 82. The substrate stage 74 is driven to move the wafer W to a position below the coating mechanism 92, and the resin 82 is applied to the wafer W. The substrate stage 74 is driven to move the imprint region coated with the resin 82 to a position under the mask M.

At this time, the position of the substrate stage 74 is measured using the length measuring device 75, and the main controller (not shown) performs alignment control of the substrate stage 74 with nanometer accuracy. As the length measuring device 75, for example, a laser interferometer or an encoder can be used. The imprint apparatus 80 further includes an alignment scope 91. An alignment mark formed on the wafer W is imaged by the alignment scope 91, and the position is calculated by image processing. Based on the position calculated in this way, imprinting is performed so as to overlap with the base with high accuracy.

After the alignment as described above is performed, the pattern surface Mp of the mask M is pressed against the imprint region coated with the resin 82 on the substrate W by moving the mold holding device 50 toward the wafer W. In order to cure the resin 82 in a state where the pattern surface Mp is pressed against the resin 82, the imprint apparatus 80 includes a light source 76. In the present embodiment, the resin 82 is cured by being irradiated with ultraviolet rays from the light source 76. The mask M is made of glass (quartz) so as to transmit ultraviolet light for curing the resin 82.

After the resin 82 is cured, By separating the mask M from the resin 82, a pattern is formed on the wafer W. After the pattern is transferred, the substrate stage 74 is driven to move the wafer W to a position below the coating mechanism 92 in order to coat the resin 82 on the imprint region where the next pattern is to be formed. In this manner, patterns can be formed in a plurality of imprint regions by repeating a series of operations for forming the imprint material on the imprint regions on the wafer W. The substrate holding device 10 according to the first embodiment of the present invention may be applied to an imprint apparatus.

(Manufacturing Method of Device as Article)

Next, a method for manufacturing a device (semiconductor device, liquid crystal display device, or the like) as an article according to an embodiment of the present invention will be described.

A semiconductor device is manufactured through a first half process in which an integrated circuit chip is formed on a wafer and a second half process in which manufacturing of the integrated circuit chip on the wafer formed in the first half process is completed as a product. The first half process includes a step of exposing a wafer coated with a photosensitive agent using the exposure apparatus described above, and a step of developing the wafer. The second half process includes an assembly process (dicing and bonding) and a packaging process (encapsulation). The liquid crystal display device is manufactured through a process of forming a transparent electrode. The step of forming the transparent electrode includes a step of coating a photosensitive agent on a glass substrate on which a transparent conductive film is deposited, a step of exposing the glass substrate coated with the photosensitive agent using the above-described exposure apparatus, and a step of developing the glass substrate.

A method for manufacturing a device (a semiconductor integrated circuit element, a liquid crystal display element, or the like) as an article includes a step of forming a pattern on a substrate (a wafer, a glass plate, or a film-like substrate) using the above-described imprint apparatus. The manufacturing method may further include a step of etching the substrate on which the pattern is formed. When another article such as a patterned medium (recording medium) or an optical element is manufactured, the manufacturing method may include another process of processing a substrate on which a pattern is formed instead of etching.

According to the device manufacturing method of the present embodiment, it is possible to manufacture a device having higher quality than the conventional method.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-147516, filed Sep. 10, 2021, which is hereby incorporated by reference herein in its entirety.

What is claimed is:

1. A method of determining an attraction abnormality in a holding device including a holding unit that holds one of a mold or a substrate used in a lithography apparatus for transferring a pattern formed on the mold to the substrate, the holding unit, which comprises a plurality of recesses that form a plurality of spaces together with the mold or the substrate, attracting and holding the mold or the substrate by reduced pressure, and the holding device further comprising a flow rate sensor, a first pressure mechanism including a vacuum pump, and a second pressure mechanism including a pressurizing pump, the method comprising:

depressurizing, with the first pressure mechanism, at least one first space among the plurality of spaces formed by the mold or the substrate and the holding unit;

pressurizing, with the second pressure mechanism, at least one second space among the plurality of spaces to a pressure different from that of the first space;

controlling the first and second pressure mechanisms so that the first and second spaces are adjacent to each other;

measuring, with the flow rate sensor, a flow rate of each of the first and second pressure mechanisms; and determining an abnormality related to attracting and holding of the mold or the substrate between the first space and the second space based on each of the measured flow rates, the abnormality including:

an increase in a gas flow rate between the first space and the second space due to a foreign substance sandwiched between the mold or the substrate and a holding surface of the holding unit between the first space and the second space; or wear of the holding surface between the first space and the second space.

2. The method according to claim 1, wherein the pressurizing pump applies a positive pressure.

3. The method according to claim 1, wherein:

the holding device further comprises a storage, the method further comprises storing, in the storage, the measured flow rates, and the determining determines a type of the abnormality based on a history of the stored measured flow rates.

4. The method according to claim 3, wherein the abnormality is an abnormality due to:

the increase in the gas flow rate; or the wear of the holding surface between the first space and the second space based on the history of the stored measured flow rates.

* * * * *